(12) United States Patent
Mullarkey et al.

(10) Patent No.: US 6,701,470 B1
(45) Date of Patent: Mar. 2, 2004

(54) METHOD FOR TESTING A MEMORY DEVICE HAVING DIFFERENT NUMBER OF DATA PADS THAN THE TESTER

(75) Inventors: Patrick J. Mullarkey, Meridian, ID (US); Michael A. Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 200 days.

(21) Appl. No.: 09/649,829

(22) Filed: Aug. 29, 2000

(51) Int. Cl.[7] .............................................. G11C 29/00
(52) U.S. Cl. ........................ 714/718; 714/719; 714/720
(58) Field of Search ................................. 714/718–720

(56) References Cited

U.S. PATENT DOCUMENTS 5,896,395 A * 4/1999 Lee ........................ 714/719 X
6,324,666 B1 * 11/2001 Nakamoto .............. 714/718 X

* cited by examiner

*Primary Examiner*—R. Stephen Dildine
(74) *Attorney, Agent, or Firm*—Schwegman, Lundberg, Woessner & Kluth, P.A.

(57) ABSTRACT

Testing a memory device having M data pads with a tester having N<M data pads, comprising writing data to the memory device in a test configuration; then in a normal configuration reading the data and writing the data back to the memory device. Subsequently the memory device is configured to a test configuration and the data is read to the tester to check for error.

23 Claims, 3 Drawing Sheets

METHOD FOR TESTING A MEMORY DEVICE HAVING DIFFERENT NUMBER OF DATA PADS THAN THE TESTER

TECHNICAL FIELD OF THE INVENTION

The present invention relates generally to semiconductor devices, and in particular to testing memory devices with a tester having a number of data pads which is smaller than that of the memory device being tested.

BACKGROUND OF THE INVENTION

Memory devices are used to store data in computers and electronic products. A typical memory device has a large number of memory cells. Each of the memory cells is capable of holding a data bit in form of a voltage level or an electrical charge. The data bit is written to or read from the memory cell through a write and a read path connected between the memory cell and an input/output pin or a data pad.

During production, the memory device goes through various tests to check for defective cells and read or write path. Typically, to test a memory device, a tester is connected to the memory device. The tester issues a number of test data sequences or commands to the memory device to test the device. The tester collects the test result and checks for errors.

The number of data channels (data pads or pins) committed to testing a memory device is a significant factor in the total expense. Therefore a typical less-expensive tester has a limited resource of a small number of data pads for connecting to only a portion of the data pads of the memory device. Thus, some of the data pads of the memory device are unconnected. Because of the limited resource or reduced data pads from the tester, a memory device is usually designed with an internal test circuit for use during a test using a data compression technique. During the test using data compression technique, a single data bit at a data pad is written and fanned-out to different locations or memory cells by the internal test circuit. Thus, the different memory cells have the same data bits. The same data bits are read in a subsequent read cycle to a match circuit. The match circuit compares the data bits to determine if they all still match. A mismatch indicates a defect in at least one of the memory cells or read/write path. The data compression technique, however, does not test read/write paths of the unconnected data pads of the memory device in one test. Although the same test can be repeated and applied to the unconnected data pads, however, the test would require additional test step. Thus, it would cost more time and is not efficient.

Thus, there is a need for another test method to test memory devices having a different number of pins than the tester.

SUMMARY OF THE INVENTION

The present invention provides a method to test read/write data paths connected between data pads and memory cells of a memory device while a large portion of data pads of the memory device are not connected to the tester.

In one embodiment, a method of testing a memory device with tester is provided. The tester has N number of data pads. The memory device has M number of data pads, where N is smaller than M. The method includes writing data to memory cells of the memory device in a test configuration. Next, the memory device is configured to normal configuration and read and write operations are performed to drive the data from memory cells out to the M data pads and then back into a different set of memory cells. Subsequently, the memory device is configured back to the test configuration and the data is read to the tester to check for error.

DETAILED DESCRIPTION OF THE INVENTION

The following detailed description refers to the accompanying drawings which form a part hereof, and shows by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
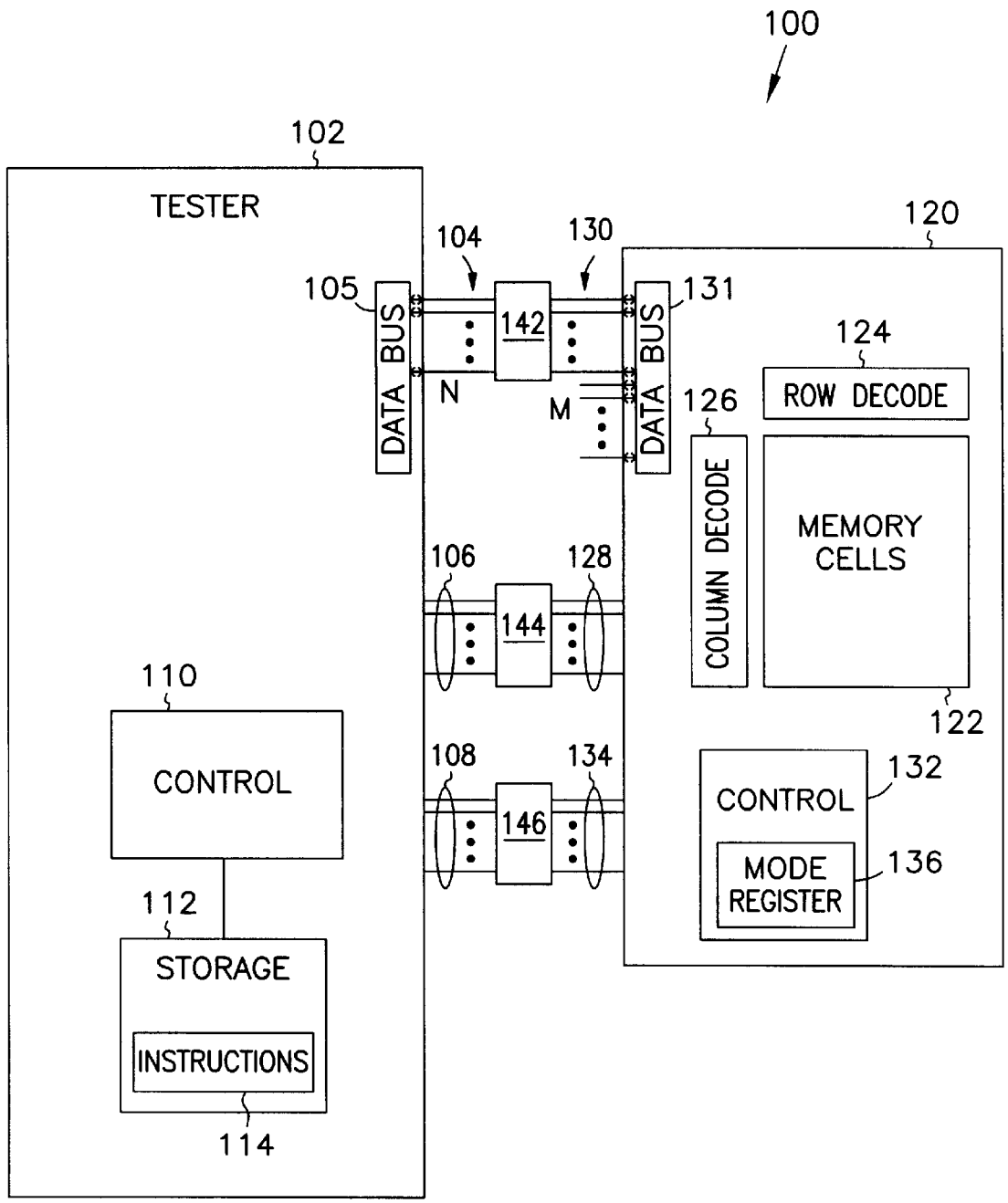
FIG. 1 is a block diagram of a test system according to one embodiment of the invention.

FIG. 1 is a block diagram of a test system 100 according to one embodiment of the invention. System 100 includes a tester 102 connected to a memory device 120. Tester 102 includes N number of input/output pins or data pads 104 connected to an N-bit wide data bus 105, a plurality of address lines 106, and a plurality of control lines 108. Tester 102 also includes a controller 110 to control data communication between tester 102 and memory device 120. Controller 110 connects to a storage medium 112. Storage medium can be any form of medium such as disc or random access memory (RAM). Storage medium 112 holds an algorithm or computer instructions 114. Controller 110 executes algorithm 114 during a test to test memory device 120 based on the algorithm. Memory device 120 includes an array of memory cells 122 arranged in rows and columns. Row decode circuit 124 and column decode circuit 126 access the rows and columns in response to an address, provided on a plurality of address lines 128. Data are transferred to and from memory device 120 through M number of input/output pins or data pads 130. M data pads are connected to an M-bit wide data bus 131 of memory device 120. A conventional memory controller 132 controls data communication to and from memory device 120 in response to command signals on control lines 134. Controller 132 also includes a mode register 136, which is configureable to hold information corresponding to different operating modes of memory device 120. Memory device 120 is connected to tester 102 via a plurality of connectors 142, 144 and 146. Data pads 104 of tester 102 connect to some of M data pads of memory device 120 through connector 142. Address lines 106 of test 102 connect to address lines 128 of memory device 120 through connector 144. Control lines 108 of tester 102 connect to control lines 134 of memory device 120 through connector 146. As shown in FIG. 1, N data pads 104 of tester 102 connect to only a portion of M data pads of memory device 120. In the embodiment of FIG. 1, N can be 4 and M can be 8, 16, 32 or any number greater than N. Therefore, the bus width or bus size (N-bit wide) of data bus 105 of tester 102 is smaller than the bus width or bus size (M-bit wide) of data bus 131 of memory device 120.

Storage medium 112 of tester 102 can be a hard disc/drive system for reading or writing information on a media such as a hard disc. Storage medium 112 can also be a magnetic or optical disc/drive system for reading from or writing to a removable media such as a disc. These disc/drive systems and their associated media can be used to hold algorithm 114 of tester 102. However, any type of media which can store data accessible, such as magnetic cassettes, flash-memory cards, optical discs, Bernoulli cartridges, random-access memories (RAMs), read only memories (ROMs), and the like, can be used to store algorithm 114 of tester 102. In addition, tester 102 can also connect to a communication line where algorithm 114 from a remote site can be loaded to tester 102 through the communication line.

Memory device 120 of FIG. 1 can be a dynamic random access memory (DRAM) or other types of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs. Those skilled in the art will readily recognize that memory device 120 of FIG. 1 is simplified to illustrate the present invention and is not intended to be a detailed description of all of the features of a memory device such as any one of the memory devices mentioned above. Furthermore, those skilled in the art will readily recognize that memory device 120 includes read and write paths connected between memory cells 122 and M data pad 130. The read paths are used to transmit data read from memory cells 122 to M data pad 130. The write paths are used to transmit data from M data pads 130 to memory cells 122.

Mode register 136 can be any type of circuit, which can hold information for activating one or several predetermined operating modes of memory device 120. For example, mode register 136 can be configured with a normal configuration to hold information for a normal operating mode. When configured in a normal operating mode, memory 120 outputs M bits of data from memory cells 122 to the M data pads in a read cycle. Also when configured in a normal operating mode, the memory writes M bits of data presented at the M data pads to memory cells 122 in a write cycle. During a test, mode register 136 is repeatedly configured by tester 102 at different times during the test to put the memory device to certain operating modes appropriate for certain sequences of algorithm 114. For example, a memory device having 16 data pads (x16 memory device) can be configured to operate as if it has only 4 data pads (x4 memory device). The configuration is done by loading or configuring the mode register with appropriate information according to the specification of the memory device.

Figure 2:
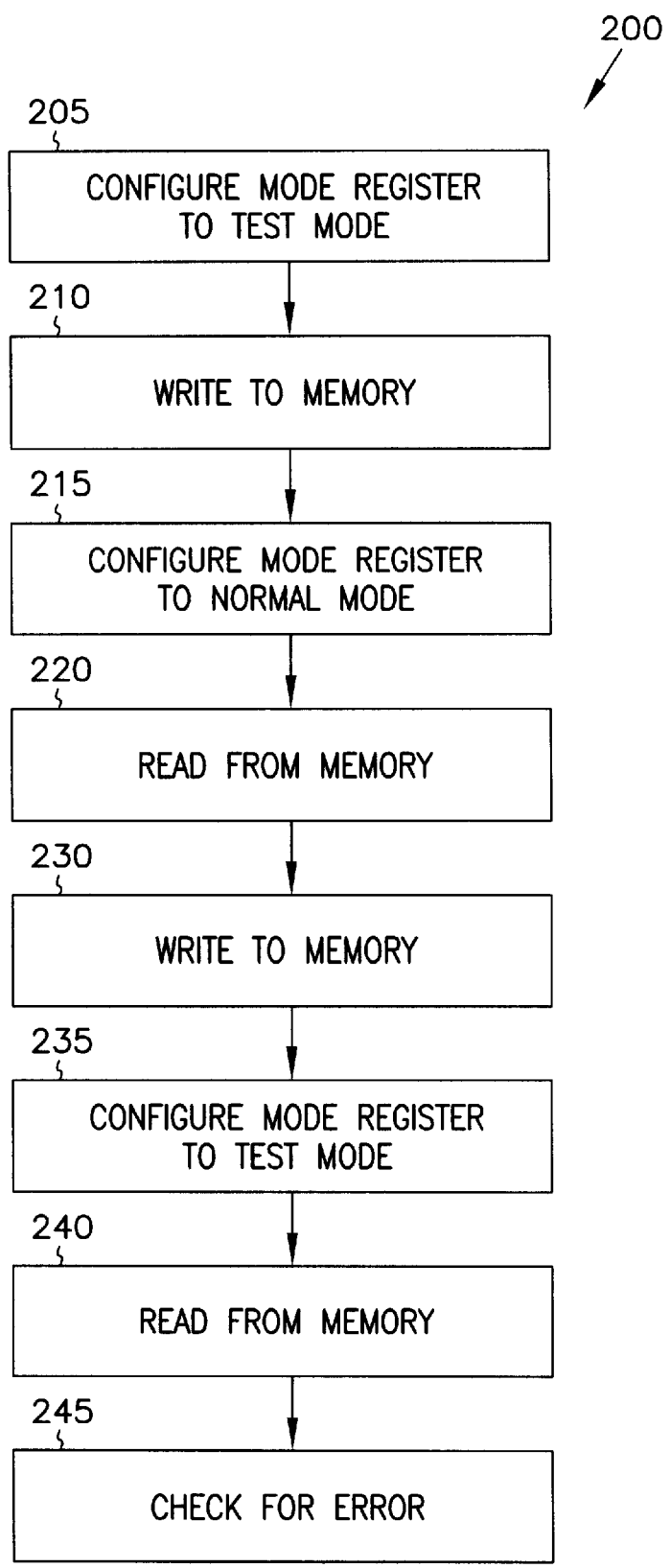
FIG. 2 is a flowchart illustrating a test method according to one embodiment of the invention.

FIG. 2 is a flow chart illustrating a test method 200 according to one embodiment of the invention to test memory device 120 as shown in FIG. 1. For the purpose of illustrating the invention, it is assumed that memory device 120 has 16 data pads (M=16), a x16 memory device. It is also assumed that tester 102 has 4 data pads (N=4), a x4 tester. In addition, terms such as configure, configuring or configured and program, programming or programmed, and load, loading or loaded are used interchangeably. The terms describe the action of putting information to the mode register and setting the tester and the memory device to a certain operating mode. Furthermore, terms such as data, data bit and bit of data describe the same subject, which is the information written to or read from memory device 120.

In box 205, tester 102 configures or loads mode register 136 of memory device 120. This configuration includes modifying or converting the current configuration of memory device 120 from a default or normal configuration (xM or x16 configuration) to a new configuration. The new configuration matches the configuration of tester 102. In this example, the new configuration loaded in mode register 136 is a xN or x4 configuration, which means memory device 120 is converted to operate as a x4 memory device. This conversion is necessary because the tester connects to only 4, not all 16, data pads of the memory device.

In box 210, tester 102 issues a write command to write a group of data bits to memory device 120. The data bits are represented in form of a binary 0 or a binary 1. A binary 1 corresponds to a high voltage level, and a binary 0 corresponds to a low voltage level. The voltage level is different among the types of memory devices. Typically a high voltage level is about 3–5 volts. A low voltage level is usually a ground. The address in the memory device where the data bits are going to is arbitrary as long as the address is known for later access. When the memory device used in this example is configured as a x16 memory device, an address includes eight binary bits from A0 to A7. When the same memory device is configured as a x4 memory device (or a x4 tester), the address has ten binary bits A0–A9. The two extra addresses in the x4 configuration are required to maintain the same memory density or depth. Thus, tester 102 can use two extra address bits (A8 and A9) to map or link the address from the tester to the memory device. The address mapping or linking is done by mapping each of 4 binary combinations (00, 01, 10, 11) of A8 and A9 to a group of 4 bits of memory device 120. Thus writing to memory device 120 at this point includes performing multiple write cycles to the memory device. In this case 4 write cycles are performed. Each of the four write cycles writes N=4 data bits from N data pads 104 to a column of memory device 120. Together, the four write cycles write 16 bits to the memory device. Writing to memory in box 210 also means writing to a column of the memory device. In some cases, a memory device has an internal test circuit to multiplex or fan out a single data bit from a data pad to more than one location within the memory device. In that case, less than 4 write cycles are needed. For example, if a memory device has an internal test circuit which fans out a data pad to 4 different locations then box 210 is performed in one write cycle. That is, in one write cycle, 4 data bits from the tester become 16 data bits within the memory device.

In box 215, tester 102 configures mode register 136 back to its normal configuration, which is a x16 configuration in this embodiment. This configuration allows the memory device to operate as a x16 memory device. Thus when the memory device receives a read command from tester 102, it will transmit data bits from memory cells 122 to all 16 data pads 130 via corresponding read paths connected to the 16 data pads, even though 12 of those data pads are not connected to anything.

In box 220, tester 102 issues a read command to memory device 120 with the same address in previous write in box 210. Upon receiving the read command, memory device 120 transmits all 16 data bits from the previous write (performed in box 210) to both connected and unconnected 16 data pads 130. The 16 data bits, in form of voltage levels, are floating at data pads 130 which can hold the states of the data bits for an amount of time, typically in microseconds or milliseconds. The purpose of reading the data bits out to data pads 130 at this point is to transfer 16 data bits to all 16 data pads for subsequent write operation. Checking for error of all 16 data bits is not conducted at this time because tester 102 is only connected to the memory device at only 4 data pads.

In box 230, tester 102 issues a write command to memory device 120 while data bits are holding at 16 data pads 130, and while memory device 120 is still in a x16 configuration. Thus this time memory device 120 performs only one write cycle to transmit all M=16 data bits from both connected and unconnected M data pads 130 to memory cells 122 through corresponding write paths within the memory device. Writing to memory in box 230 also means writing to the same or to another column of the memory device. Up to this point, the 16 data bits have completed a round trip between all 16 data pads 130 and memory cells 122. The first trip is from the read in a x16 configuration performed in box 220. The second trip is from the write in a x16 configuration in this box 230. Thus both read and write paths connected to the 16 data pads have been utilized. Therefore the 16 data bit can be read to check for error at the next sequence of the algorithm.

In box 235, tester 102 configures mode register 136 to a x4 configuration. The x4 configuration is necessary at this point because all 16 data bits from memory device 120 need to be read or transferred back to the tester to check for error.

In box 240, tester 102 issues a read command to memory device 120. This read command is done while memory device 120 is in a x4 configuration. Therefore, the 16 data bits are read to tester 102 in multiple groups of N bit or 4 bits at a time and the data bits are transmitted to the tester through only the connected data pads via connector 142.

In box 245, the 16 data bits read in box 240 are checked for error. If the 16 data bits resulting from the read in box 240 match the 16 data bits previously written to memory device 120 in box 210, then the read and write paths of memory device 120 function properly. If there is a mismatch between the 16 data bits resulting from this read and the 16 data bits previously written in box 210, then there is a defective read or write path within memory device 120. In either case, a match or a mismatch, method 200 demonstrates that a tester having 4 data pads can test all read and write paths of a memory device having 16 data pads.

Figure 3:
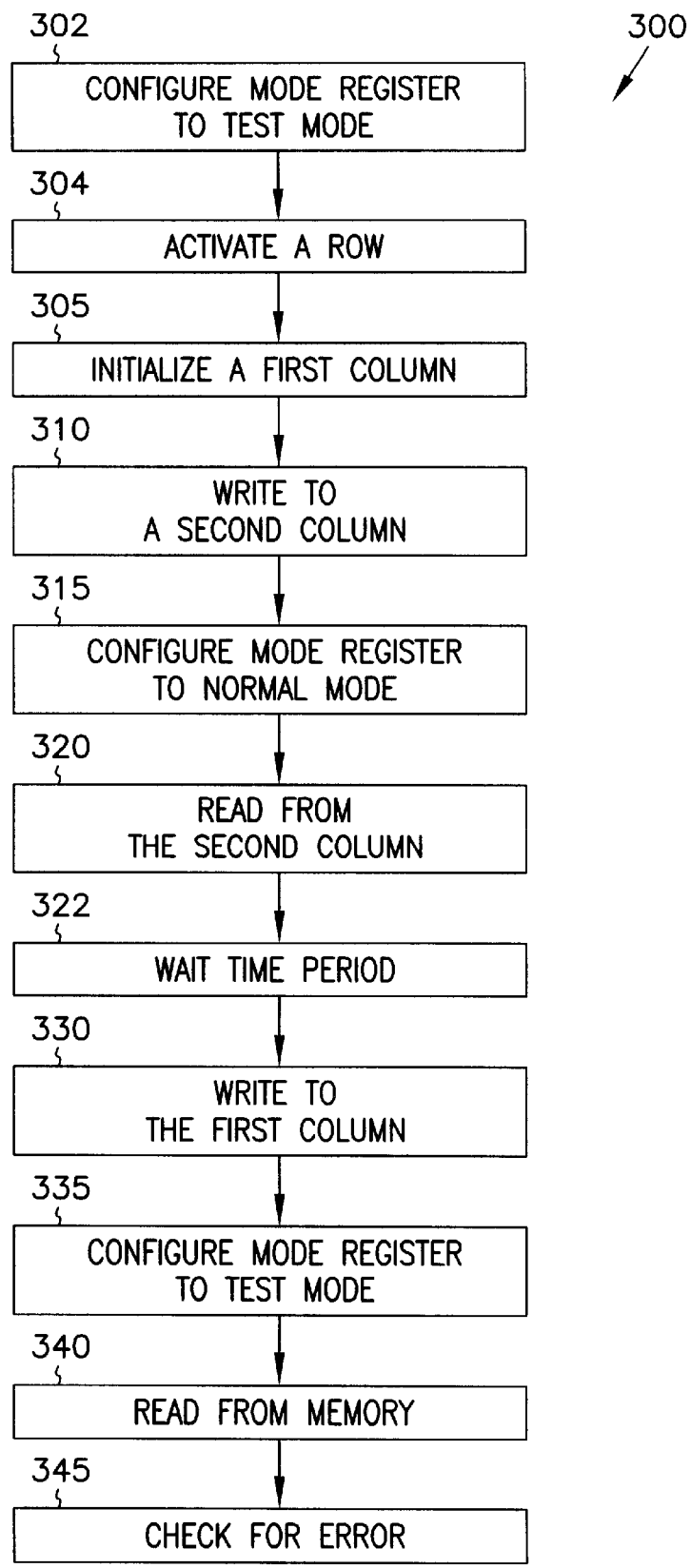
FIG. 3 is a flowchart illustrating a test method according to another embodiment of the invention.

FIG. 3 is a flow chart illustrating a test method 300 according to another embodiment of the invention to test memory device 120 as shown in FIG. 1. In FIG. 3, method 300 includes boxes 302–345. Method 300 is similar to method 200 with the exception of certain sequences and functions.

In box 302, tester 102 configures or loads mode register 136 of memory device 120. The function performed in box 302 is the same as the function performed in box 205 of FIG. 2. In box 304, tester 102 activates a row of memory cells 122. In box 305, tester 102 initializes a first column of memory cells 122. The initialization includes configuring mode register 136 in a x4 configuration and issuing a write command to write a first set of M=16 data bits to the first column. Writing the data bits at this point is done in 4 write cycles. The first set of data bits can be all high (binary 1) or all low (binary 0). For the purpose of illustrating the invention, the data bits are all low voltage level bits.

In box 310, tester 102 issues a write command to write a second set of data bits to a second column corresponding to the row activated in box 304. The second set of data bits can be all high, which is opposite from the first set of data bits. Box 315 is the same as box 215 of method 200. In box 320, tester 102 issues a read command to read the data bits from the second column to 16 data pads 130.

In box 322, tester 102 issues a wait time period. The wait time period allows a predetermined amount of time to elapse to see if each of the data pads 130 still hold the voltage level representing a data bit to a safe predetermined level after the wait time. This is one way to check for any leakage along the path or at the data pad.

In box 330, tester 102 issues a write command to write to the first column. At this point, data pads 130 hold the second set of data bits read from the second column (in box 320). The second set of data bits have an opposite voltage level from the first set of data bits and can be written back to the second column or to any other column within memory cell 122. However, by writing data bits having opposite voltage level to the first column at this point, the memory device is put under opposite testing conditions, thus increasing the chance of detecting a defect in the memory device. Boxes 335, 340 and 345 are the same as boxes 235, 240 and 245 of method 200, respectively.

Methods 200 and 300 shown in FIGS. 2 and 3 are described using a x16 memory device as an example. The x16 memory device has 16 input/output pins or data pads. Those skilled in the art will readily recognize that methods 200 and 300 can also be slightly modified to test other memory devices having different numbers of data pads. For example, to test a x32 memory device, boxes 215 or 315 can be modified by configuring the mode register to a x32 configuration. Furthermore, tester 102 of the invention is described as a x4 tester-but it could easily be configured as a x2 tester. In addition, the connected M data pads 130 can either be driven by tester 102 during a write cycle or load on N data pads 104 needs to be deselected.

Although specific embodiments have been illustrated and described herein, it will be appreciated by those of ordinary skill in the art that any arrangement which is calculated to achieve the same purpose may be substituted for the specific embodiment shown. For example, in some cases, the number of N data pads is the same as the number of M data pads. However, the effective number of N data pads being used for the test may not be the same as the number of M data pads. On reason is that some of the N and M data pads are not physically connected. Another reason can be that some of the N data pads in are diverted internally to tester 102; or there is no physical connection between some of the M data pads and the internal circuitry of memory device 120. This application is intended to cover any adaptations or variations of the invention. Therefore, it is intended that this invention be limited only by the claims and the equivalents thereof.

What is claimed is:

1. A method of testing a memory device with a tester, the tester having N data pads, the memory device having M data pads, wherein N is smaller than M, the method comprising:

configuring the memory device to match a configuration of the tester;

writing data to a column of the memory device;

configuring the memory device with a normal configuration of the memory device;

reading the data from the column to the data pads of the memory device;

writing the data from the data pads of the memory device to another column of the memory device;

configuring the memory device to match the configuration of the tester; and reading the data from the other column to the tester to check for error.

2. The method of claim 1, wherein configuring the memory device to match a configuration of the tester in both occurrences includes modifying a current configuration of the memory device from a xM configuration to a xN configuration.

3. The method of claim 1, wherein writing to a column of the memory includes performing multiple write cycles to the memory device.

4. The method of claim 1, wherein configuring the memory device with a normal configuration of the memory device includes changing a current configuration of the memory device to a xM configuration.

5. The method of claim 1, wherein writing the data from the data pads of the memory device to another column of the memory device includes performing one write cycle to transmit M data bits to the other column of the memory.

6. The method of claim 1, wherein reading the data from the other column to the tester to check for error includes reading multiple groups of N data bits to the tester.

7. A method of testing a memory device with a tester, the tester having N data pads; the memory device having M data pads, wherein N is smaller than M, the method comprising:
    writing data to the memory device in a test configuration;
    reading the data from the memory device and writing the data back to the memory device in a normal configuration; and
    reading the data to the tester to check for error in the test configuration.

8. The method of claim 7, wherein writing data to the memory device in a test configuration includes transmitting N data bits at a time from the tester to the memory device.

9. The method of claim 7, wherein reading the data from the memory device and writing the data back to the memory device in a normal configuration includes reading the data from memory cells of the memory device to the M data pads and, while the data is present at the data pads, writing the same data back to the memory cells of the memory device.

10. The method of claim 7, wherein reading the data to the tester to check for error includes reading N data bits at a time to the tester.

11. A method of testing a memory device with a tester, the tester having N data pads, the memory device having M data pads, wherein N is smaller than M, the method comprising:
    configuring the memory device to match a configuration of the tester;
    writing a first column of the memory device with a first set of data;
    writing a second set of data to a second column of the memory device;
    configuring the memory device with a normal configuration of the memory device;
    reading the second set of data from the second column to the data pads of the memory device;
    writing the second set of data from the data pads of the memory device to the first column of the memory device;
    configuring the memory device to match the configuration of the tester; and
    reading the second set of data from the first column to the tester to check for error.

12. The method of claim 11, wherein writing the second set of data to a second column includes writing data with opposite voltage level from the data of the first set of data.

13. The method of claim 11, wherein reading the second set of data from the second column to the data pads includes reading the second set without checking for error.

14. The method of claim 11, wherein writing the second set of data from the data pads includes writing data from connected and unconnected data pads of the memory device.

15. A method of testing a memory device with a tester, the tester having N number of data pads, the memory device having M data pads, wherein N is smaller than M, the method comprising:
    modifying a configuration of the memory device to suit a configuration of a tester;
    writing data to the memory cells of the memory device;
    configuring the memory device with a normal configuration of the memory device;
    reading the data from the memory cells to data pads of the memory device;
    writing the data from the data pads to the memory cells of the memory device;
    modifying the configuration of the memory device to suit the configuration of the tester; and
    reading the data from the memory cells to the tester to detect for error.

16. The method of claim 15, wherein writing data to the memory cells includes writing data to a first column of the memory cells.

17. The method of claim 15, wherein writing the data from the data pads to the memory cells includes writing data to the same location in the memory cells.

18. The method of claim 15, wherein writing the data from the data pads to the memory cells includes writing data to a second column of the memory cells.

19. A method of testing a memory device with a tester, the tester having N-bit wide data bus, the memory device having M-bit wide data bus, wherein N is smaller than M, the method comprising:
    configuring the memory to accommodate the N-bit wide data bus;
    writing N bits of data to a first column of the memory device;
    configuring the memory device to accommodate the M-bit wide data bus;
    reading the data from the first column to data pads of the memory device;
    writing the data from the data pads of the memory device to a second column of the memory device;
    configuring the memory to accommodate the N-bit wide data bus; and
    reading the data from the second column to detect error.

20. The method of claim 19 further comprising checking for leakage of voltage level representing data bits while the data bits are present at M data pads of the memory device.

21. A method of testing a memory device with a tester, the tester having N input/output (I/O) pins, the memory device having M I/O pins, wherein N is smaller than M, the method comprising:
    loading a mode register of the memory device with a configuration according to an operating mode of the tester;
    writing data to a first column of the memory device according to a link map;
    loading the mode register with a configuration according to a normal operating mode of the memory device;
    reading the data from the first column to the I/O pads of the memory device;
    writing the data from the I/O pads of the memory device to a second column of the memory device;
    loading the mode register of the memory device with a configuration according to the operating mode of the tester; and
    reading the data from the second column to the tester to detect for error.

22. A tester to test a memory device having M data pads, a plurality of address lines and a mode register, the tester comprising:
- N data pads connected to a portion of the M data pads, wherein N is smaller than M;
- a plurality of address lines connected to the address lines of the memory device;
- a plurality of control lines connected to the memory device to provide control commands to the memory device;
- a controller to control communication between the tester and the memory; and
- a storage medium connected to the controller, the storage medium holding computer instructions for executing a method, the method comprising:
  - configuring the memory device to match a configuration of the tester;
  - writing data to a first column of the memory device;
  - configuring the memory device with a normal configuration of the memory device;
  - reading the data from the first column to the data pads of the memory device;
  - writing the data from the data pads of the memory device to a second column of the memory device;
  - configuring the memory device to match the configuration of the tester; and
  - reading the data from the second column to the tester to check for error.

23. A storage medium holding computer readable instructions and data for causing a suitably programmed tester to perform the method of:
- writing data to the memory device in a test configuration;
- reading the data from the memory device and writing the data back to the memory device in a normal configuration; and
- reading the data to the tester to check for error in the test configuration.

* * * * *